United States Patent [19]
Matsukawa

[11] Patent Number: 5,182,227
[45] Date of Patent: Jan. 26, 1993

[54] SEMICONDUCTOR DEVICE AND METHOD FOR MANUFACTURING THE SAME

[75] Inventor: Takayuki Matsukawa, Hyogo, Japan

[73] Assignee: Mitsubishi Denki Kabushiki Kaisha, Tokyo, Japan

[21] Appl. No.: 590,189

[22] Filed: Sep. 28, 1990

Related U.S. Application Data

[60] Division of Ser. No. 344,511, Apr. 20, 1989, abandoned, which is a continuation of Ser. No. 41,672, Apr. 23, 1987, abandoned.

[30] Foreign Application Priority Data

Apr. 25, 1986 [JP] Japan .................. 61-97218
May 14, 1986 [JP] Japan .................. 61-112017

[51] Int. Cl.[5] ........................................... H01L 21/76
[52] U.S. Cl. .................................... 437/72; 437/73
[58] Field of Search ............. 437/52, 72, 73; 357/49; 148/DIG. 117, DIG. 86

[56] References Cited

U.S. PATENT DOCUMENTS

| | | | |
|---|---|---|---|
| 4,606,011 | 8/1986 | Wada et al. | 365/149 |
| 4,672,410 | 6/1987 | Miura et al. | 357/23.6 |
| 4,713,677 | 12/1987 | Tiselaar et al. | 357/23.5 |
| 4,814,840 | 4/1989 | Kameda | 357/23.5 |
| 4,845,048 | 7/1989 | Tamaki et al. | 437/73 |
| 4,923,563 | 5/1990 | Lee | 437/73 |
| 4,986,879 | 1/1991 | Lee | 437/73 |

FOREIGN PATENT DOCUMENTS

| | | |
|---|---|---|
| 0176254 | 4/1986 | European Pat. Off. . |
| 0187596 | 7/1986 | European Pat. Off. . |
| 3225961 | 1/1984 | Fed. Rep. of Germany ...... 437/73 |
| 3334624 | 4/1984 | Fed. Rep. of Germany ...... 437/73 |
| 3400590 | 9/1989 | Fed. Rep. of Germany ...... 437/73 |
| 58-56437 | 4/1983 | Japan ...... 437/73 |
| 58-98944 | 6/1983 | Japan ...... 437/73 |
| 58-212161 | 12/1983 | Japan . |
| 59-191374 | 10/1984 | Japan . |
| 59-202648 | 11/1984 | Japan ...... 437/73 |
| 60-113460 | 6/1985 | Japan . |
| 60-224260 | 11/1985 | Japan . |
| 60-261168 | 12/1985 | Japan . |
| 61-56449 | 3/1986 | Japan . |
| 61-56450 | 3/1986 | Japan . |
| 61-67955 | 4/1986 | Japan . |
| 62-211938 | 9/1987 | Japan ...... 437/73 |
| 1-244636 | 9/1989 | Japan ...... 437/73 |

OTHER PUBLICATIONS

Wolf, S., *Silicon Processing for the VLSI ERA*, vol. 2, Jun. 1990, pp. 33, 48.
Technical Digest, International Electron Device Meeting 1984, pp. 236–239, Nakamura et al.

*Primary Examiner*—George Fourson
*Attorney, Agent, or Firm*—Lowe, Price, Le Blanc & Becker

[57] ABSTRACT

MOS transistors connected to each other are electrically isolated at both ends of a transfer gate by an LOCOS oxide film, and the bottom surface in a trenched capacitor portion and the side wall of a trench between adjacent capacitors are electrically isolated. A leakage current can be reduced, so that a semiconductor device comprising a capacitor having a reduced occupied area and large capacitance can be obtained.

4 Claims, 13 Drawing Sheets

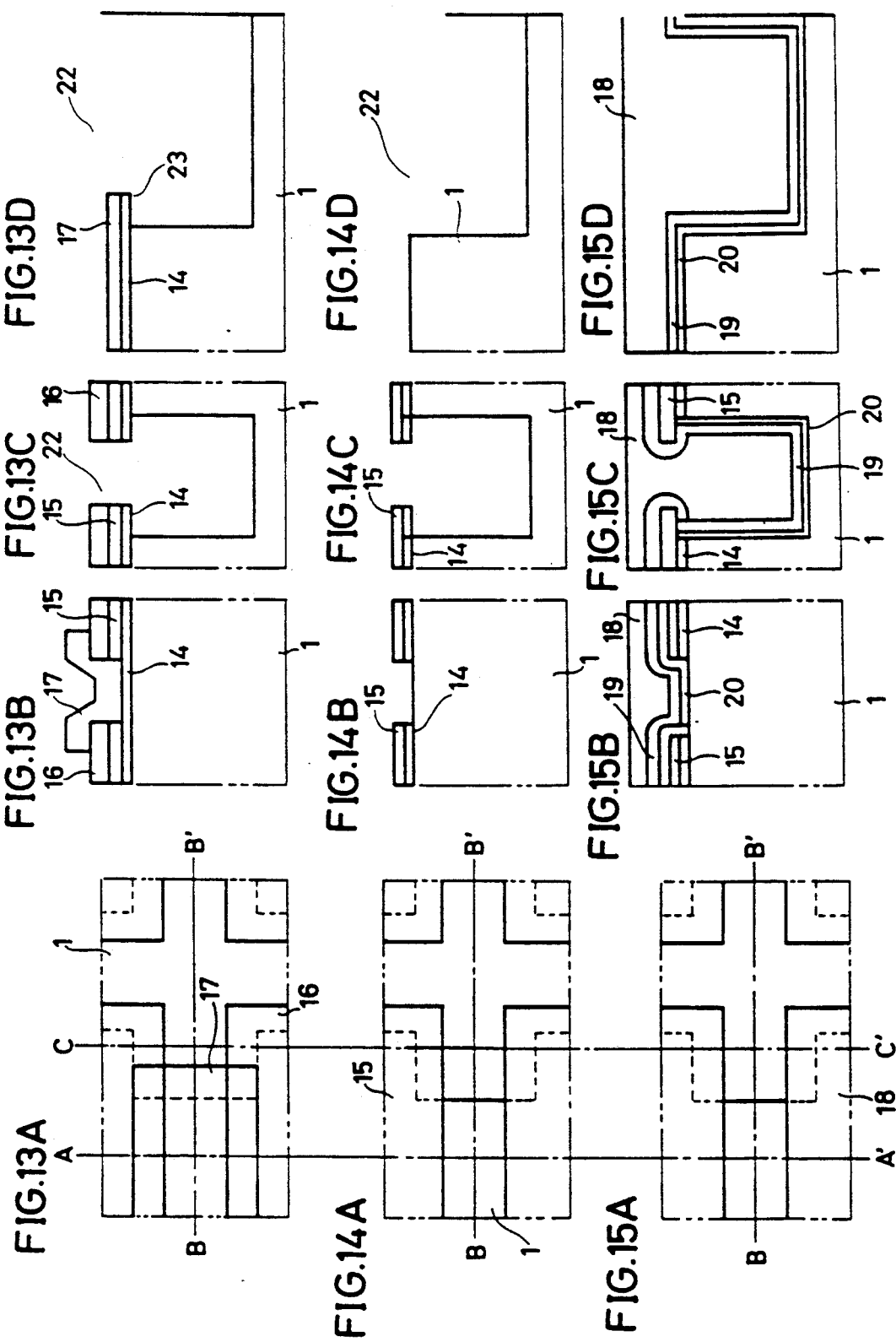

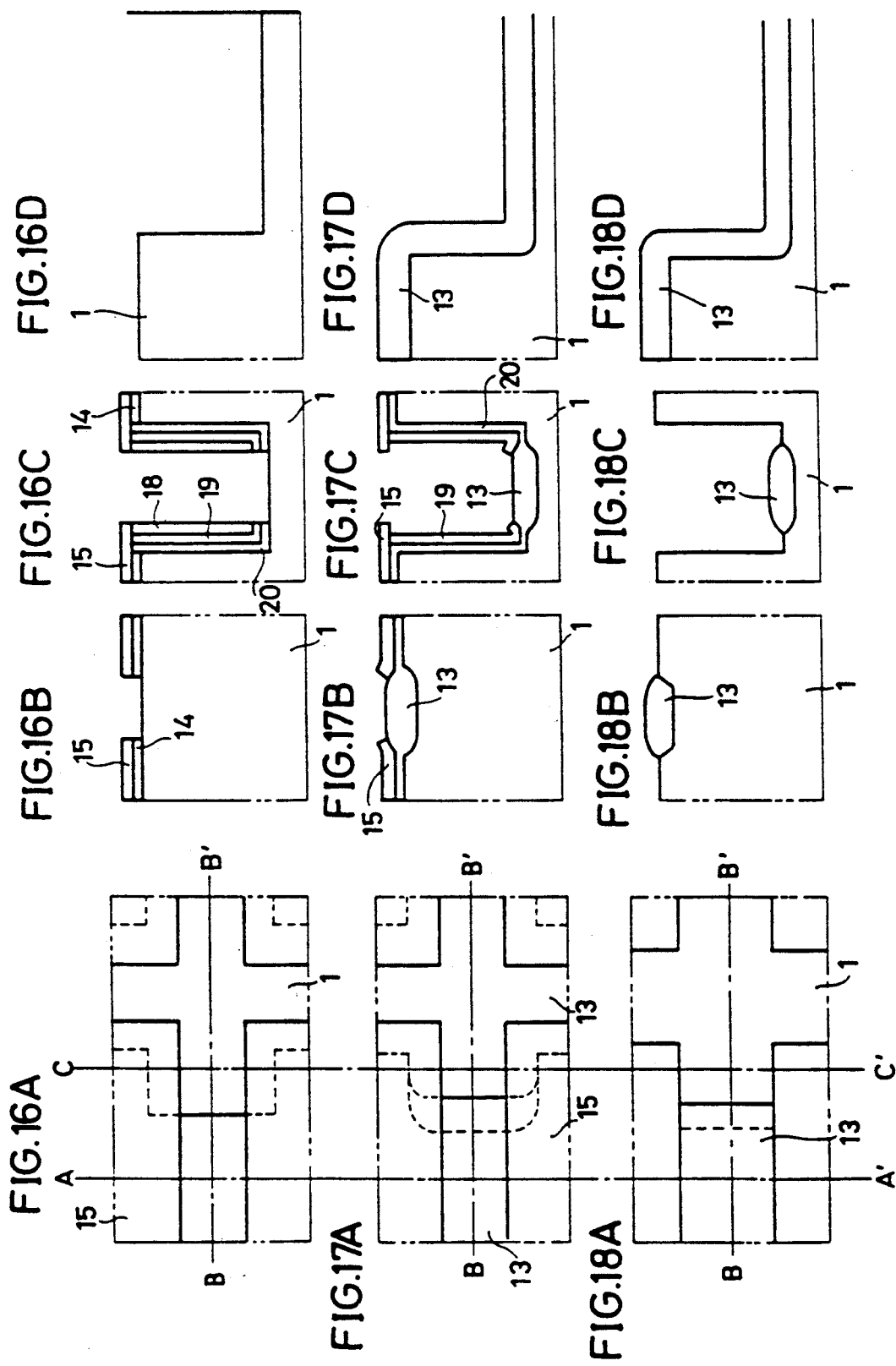

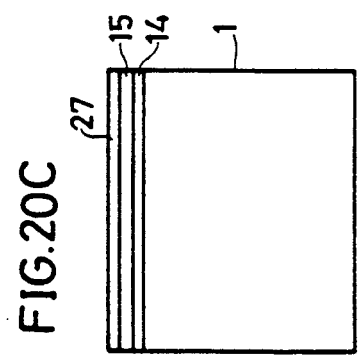
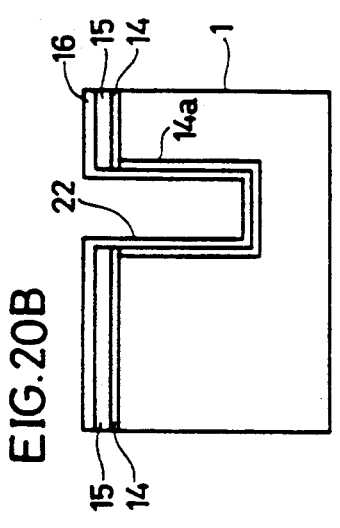
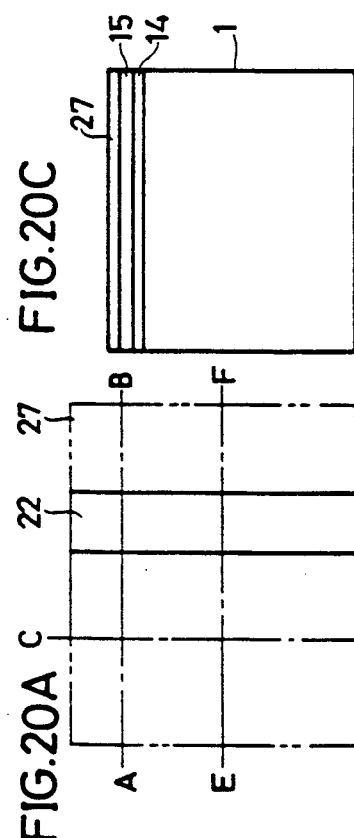
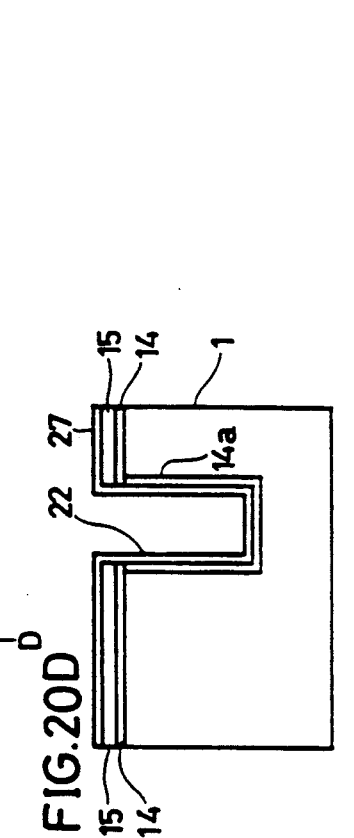
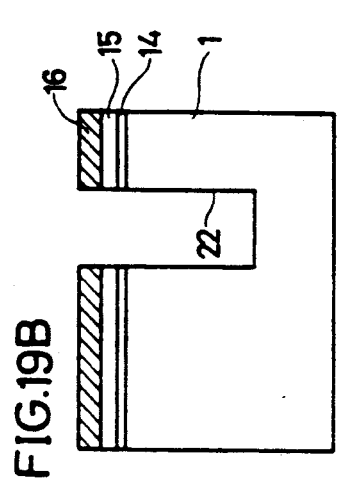
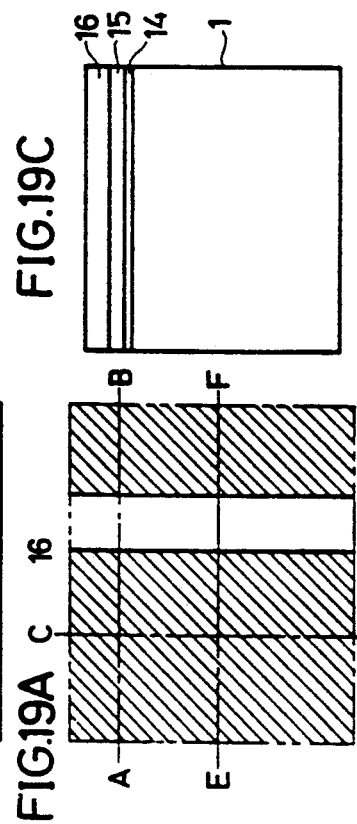
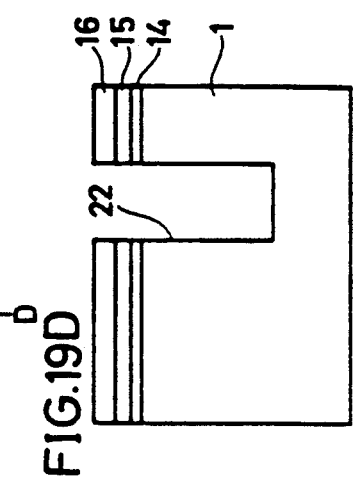

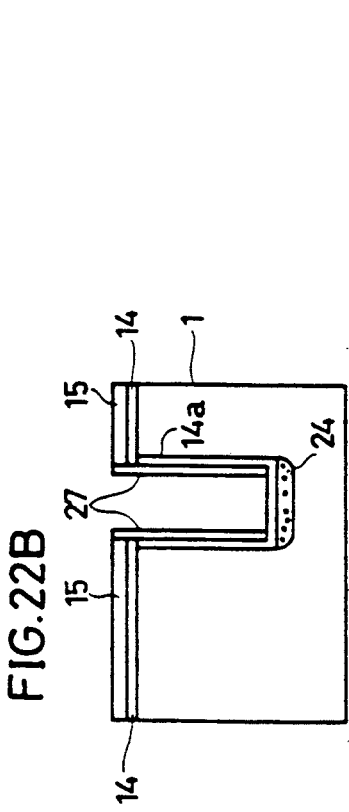
FIG.21B
FIG.21A
FIG.21D
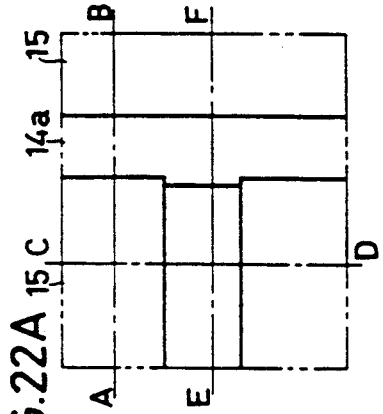
FIG.21C
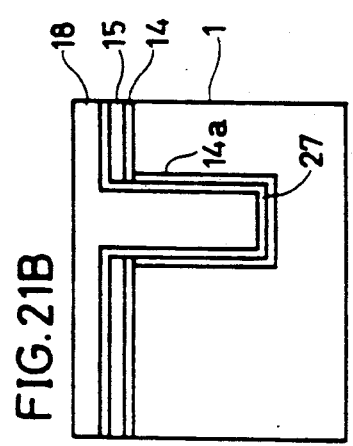
FIG.22B
FIG.22A
FIG.22D
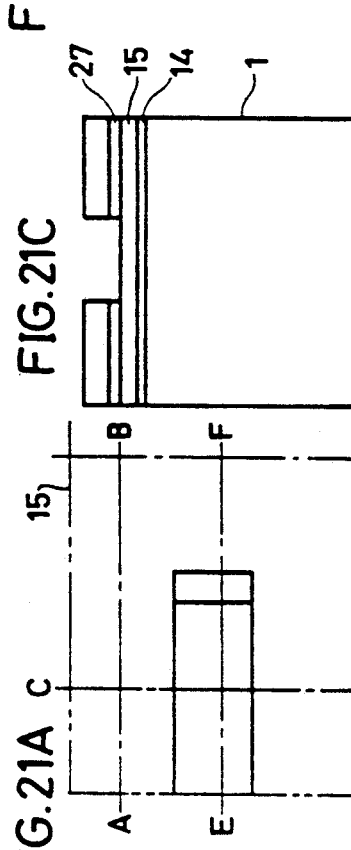
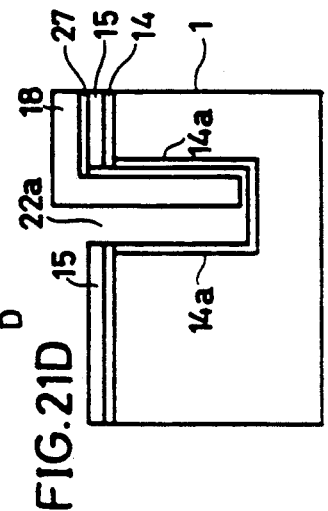
FIG.22C
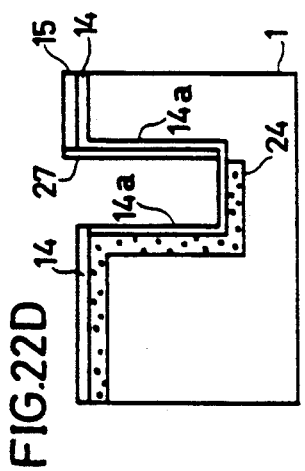

SEMICONDUCTOR DEVICE AND METHOD FOR MANUFACTURING THE SAME

This application is a division of application Ser. No. 344,511, filed Apr. 20, 1989, now abandoned, which is a continuation of application Ser. No. 041,672, filed Apr. 23, 1987, now abandoned.

BACKGROUND OF THE INVENTION

1. Field of the Invention

The present invention relates to a semiconductor device and a method for manufacturing the same. More particularly, it relates to a structure of an MOS (Metal-Oxide-Semiconductor) dynamic RAM (Random Access Memory) including a trench structure and a method for manufacturing the same.

2. Description of the Prior Art

FIG. 1 is a diagram showing a structure of a memory cell portion of a conventional MOS dynamic RAM, FIG. 2 is a cross sectional view taken along a line II—II shown in FIG. 1, FIG. 3 is a cross sectional view taken along a line III—III shown in FIG. 1, FIG. 4 is a perspective view showing a structure of a memory cell portion of a dynamic RAM shown in FIG. 1, and FIG. 5 is an electric circuit diagram of a cell for constituting a dynamic RAM.

The MOS dynamic RAM shown in FIGS. 1 to 5, which is disclosed in, for example, Technical Digest, pp. 236-239, in International Electron Device Meeting 1984, comprises memory cells each having a single transistor and a single capacitor, as shown in FIG. 5. The basic operation is described in detail in a general textbook, for example, by W. N. Carr and J. P. Mize and translated by Ryo Terashima, entitled "MOS/LSI Design and Application", Electronics Digest (Inc.), 1977, P. 195 and hence, it is omitted. Only the operational principle is described in the following.

As shown in FIG. 4, a silicon substrate 1 and a capacitor electrode 9 are arranged such that a thin film 32 of silicon oxide by thermal oxidation, having, for example, a thickness of 10 to 20 nm, is interposed therebetween, where a memory capacitor 33 is formed. In order to reduce the area occupied by the memory capacitor 33, a trench 30 is formed in the silicon substrate 1 so that the opposing area of the memory capacitor 33 may be increased, as clear in comparison of FIG. 3 with FIG. 4. The memory capacitor 33 serves as a memory depending on whether charges are stored in the memory capacitor 33 or not. Word lines 5 and bit lines 7 are arranged orthogonal to each other in a matrix manner so that a particular one out of a large number of memory capacitors 33 arranged on an array may be selected when a write operation or a read operation are performed.

The word line 5 extends over the silicon substrate 1 and a silicon oxide film 2 formed thereon, where a channel 11 of an MOS transistor if formed. The MOS transistor is referred to as a transfer gate and serves as a switch for switching an electrical connection or disconnection between the memory capacitor 33 and the bit line 7. The transfer gate has one conduction terminal connected to the memory capacitor 33 through a diffusion layer 31 and other conduction terminal connected to the bit line 7 through a contact 10. Whether a signal transmitted through the bit line 7 bears charges or not (that is, a signal from the memory is at an "H" or an "L" level) is determined by a discriminator circuit referred to as a sense amplifier. In order to electrically isolate a cell from the other cell in the memory, an impurity diffusion layer 3 which is a region having high impurity concentration is formed in the bottom portion of the trench 30 in the memory capacitor 33, and an insulating material 4 such as silicon oxide is buried in the trenches other than the memory capacitor portions, so that buried insulator layers are formed. An interlayer insulating layer 6 is used to isolate the bit line 7 from the word line 5 and the capacitor electrode 9.

FIGS. 6A and 6B are perspective views for explaining a method for manufacturing a conventional dynamic RAM.

Referring now to FIGS. 6A and 6B, description is made on a method for manufacturing a conventional semiconductor device having a trench structure. In FIG. 6A, a trench structure 30 is formed on a major surface of a silicon substrate 1. In addition, in order to form an integrated circuit on the silicon substrate 1 by the subsequent processes, surfaces A and B which are separated side surfaces of the trench structure 30 and a surface C which is the major surface of the silicon substrate 1 must be electrically isolated from each other. Such electrical isolation on the surface of the semiconductor substrate is referred to as field isolation. In a conventional large scale integrated circuit (LSI) having no trench structure as shown in FIG. 6A, field isolation on the surface of the semiconductor substrate is performed by a so-called LOCOS (Local Oxidation of Silicon) process which is a selective oxidation process utilizing a silicon nitride film. Such a LOCOS process is disclosed in U.S. Pat. No. 3,544,858. However, an effective method for applying the LOCOS process to the side wall of the trench structure 30 of the semiconductor substrate has not been found. Thus, in the silicon substrate 1 having the trench structure 30 formed therein as shown in FIG. 6A, an insulating material 4 such as silicon oxide is filled in the trench 30 as shown in FIG. 6B, so that required field isolation is performed. In order to fill the insulating material 4, the entire inside of the trench structure 30 is temporarily filled with the insulating material 4 by chemical vapor deposition (CVD), a necessary portion is covered with resist by a photolithographic process, and the whole or a part of an unnecessary portion of the insulating material 4 are etched away. Therefore, electrical isolation on the surfaces A, B and C is achieved, so that the subsequent processes for manufacturing an integrated circuit are performed.

A conventional semiconductor substrate having a trench structure 30 is manufactured by the above described method. Therefore, in performing field isolation, the isolated region is covered with resist having margin ($\alpha$ and $\beta$ in FIG. 6B) required for compensating for misalignment of a mask in photolithography so that etching is performed. Therefore, the insulating material 4 extends in the lateral direction on the side surfaces A and B of the trench structure 30 as shown in FIG. 6B, so that the larger area is wasted for field isolation. In addition, it is difficult to hold the heights of the major surface of the silicon substrate 1 and the upper surface of the filled insulating material 4 at the same level. For example, a step occurs in the portion shown by $\gamma$ in FIG. 6B, so that a leak current increases in the subsequent processes for manufacturing an integrated circuit (for example, an MOS transistor).

SUMMARY OF THE INVENTION

Therefore, a principal object of the present invention is to provide a semiconductor device comprising a capacitor having a reduced occupied area and large capacitance, by utilizing a conventionally reliable LOCOS (Local Oxidation of Silicon) isolation on both sides of a transfer gate to reduce a leakage current and by trenching a capacitor portion to isolate MOS transistors from each other in the bottom portion of a trench.

Briefly stated, LOCOS isolation is performed by selectively oxidizing only a required portion on the side wall of a trench region in a self-aligning manner so that both sides of the transfer gate can be isolated by an LOCOS oxide film having a reduced amount of an unusual leakage current. Selective LOCOS oxidation of the side wall of the trench region is achieved by a process in which a silicon nitride film is left in only a required region on the side wall by successfully combining anisotropic etching with isotropic etching.

Therefore, in accordance with the present invention, since adjacent memory cells are electrically isolated by the LOCOS oxide film formed on the side wall of the trench in the self-aligning manner, while they were isolated by filling a part of the trench with an insulating material in a conventional process, the trench need not be formed in the region in which the transfer gate is formed. In addition, since the MOS transistor for transfer gate is isolated by the LOCOS oxide film formed on an original silicon surface, no unusual leakage current is generated.

According to a preferred embodiment of the present invention, the selective oxidation of the side surface of the trench is performed in a self-aligning manner, utilizing a flange portion in the upper and portion of the trench.

In a method for manufacturing the semiconductor device according to the present invention, the trench is formed in apart of the semiconductor substrate and the silicon nitride film is formed on the major surface of the semiconductor substrate and on the entire surface of the region inside the trench. The silicon nitride film is selectively removed so that a first field isolation region may be defined on the major surface of the semiconductor substrate, a second filed isolation region may be defined on the side surface of the trench to adjoin the first field isolation region and the third field isolation region may be defined in the bottom portion of the trench. Furthermore, field oxide films are formed in the first, second and third field isolation regions, respectively, by a selective oxidation process.

Therefore, in a method for manufacturing the semiconductor device according to the present invention, since the field isolation region in a planar portion of the semiconductor substrate, the field isolation region on the side surface of a trench structure and the field isolation region on the bottom surface thereof are formed in a self-aligning manner by the selective oxidation process, the field isolation regions are connected to each other without any loss due to matching margin, so that integration of the semiconductor device can be improved. Furthermore, since no step occurs between the surface of the semiconductor substrate and the filed isolation region, a leak current of an integrated circuit formed on the semiconductor substrate by the subsequent process can be reduced.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 10A to 18A are plan views for explaining a manufacturing method according to an embodiment of the present invention;

FIGS. 10B to 18B are cross sectional views taken along a line A—A' shown in FIGS. 10A to 18A;

FIGS. 10C to 12C are cross sectional views taken along a line B—B' shown in FIGS. 10A to 12A;

FIGS. 13C to 18C are cross sectional views taken along a line C—C' shown in FIGS. 13A to 18A;

FIGS. 13D to 18D are cross sectional views taken along a line B—B' shown in FIGS. 13A to 18A;

FIGS. 19A to 24D are diagrams showing each process step according to another embodiment of the present invention, FIGS. 19A to 24A are plan views of the semiconductor device, FIGS. 19B to 24B are cross sectional views taken along a line A—B shown in FIGS. 19A to 24A, FIGS. 19C to 24C are cross sectional views taken along a line C—D shown in FIGS. 19A to 24A, FIGS. 19D to 24D are cross sectional views taken along a line E-F shown in FIGS. 19A to 24A;

DESCRIPTION OF THE PREFERRED EMBODIMENTS

Figure 7:
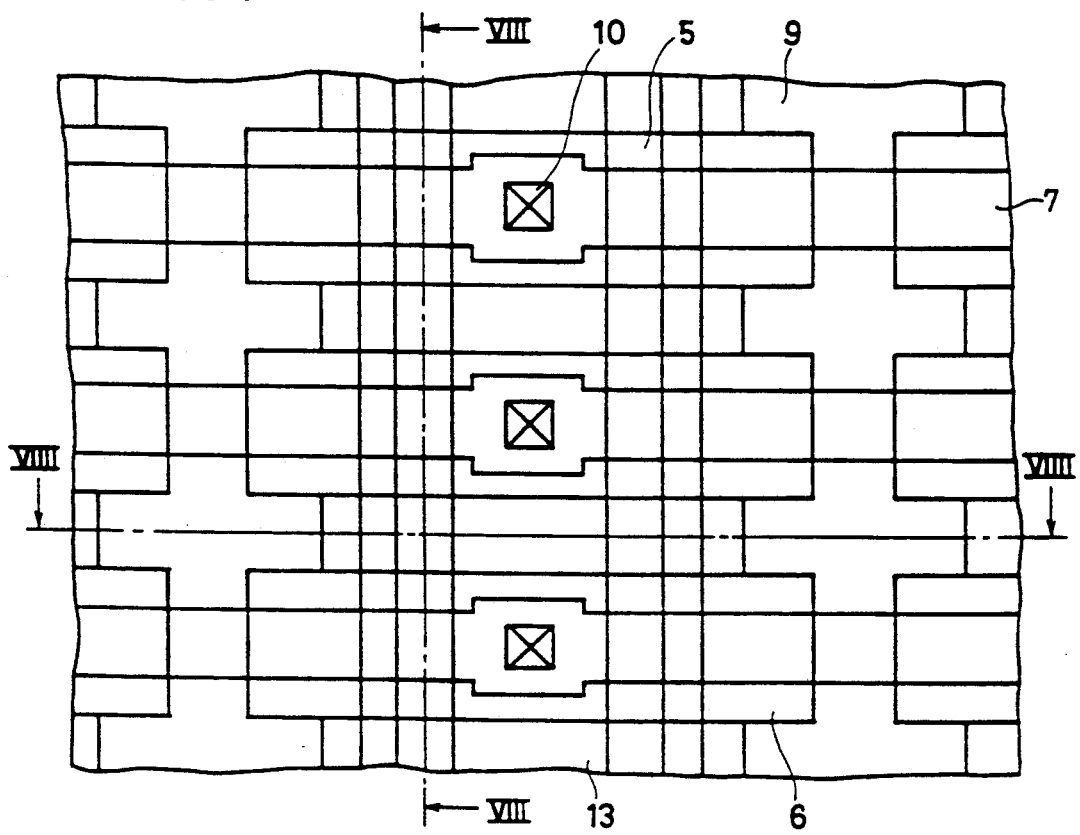
FIG. 7 is a plan view according to an embodiment of the present invention.
Figure 8:
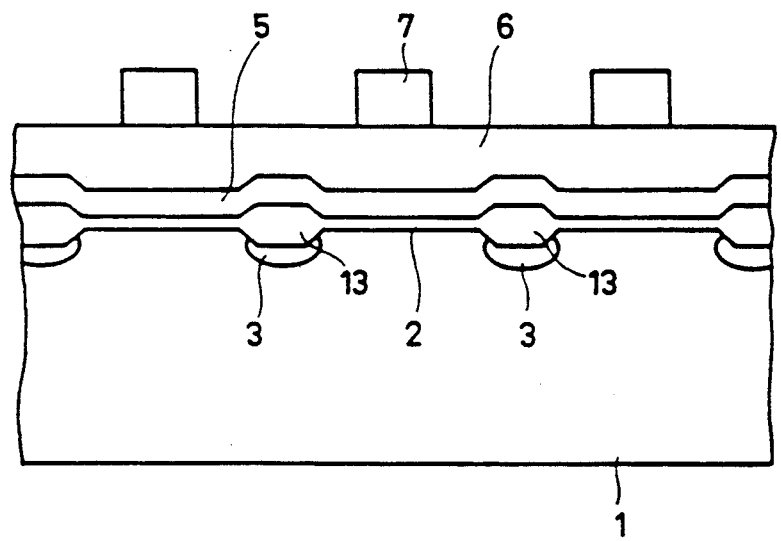
FIG. 8 is a cross sectional view taken along a line VIII—VIII shown in FIG. 7.
Figure 9:
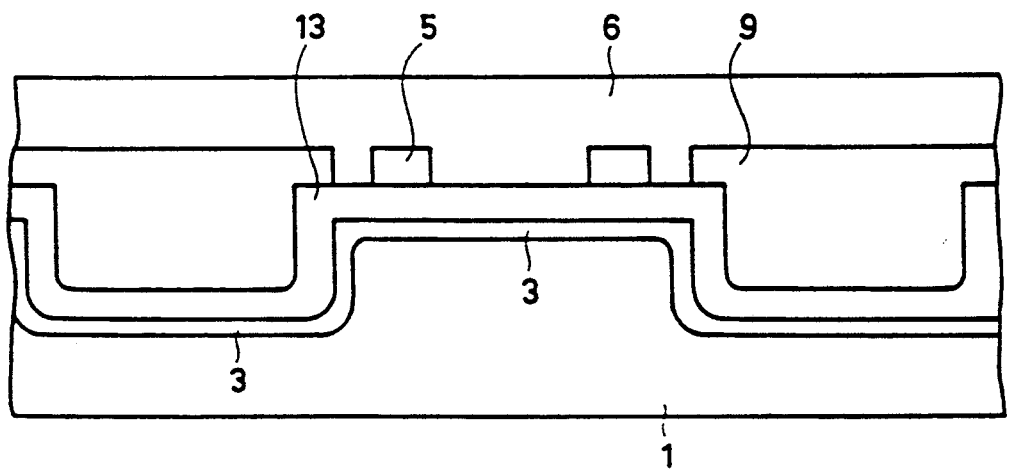
FIG. 9 is a cross sectional view taken along a line VIIII—VIIII shown in FIG. 7.
Figure 10C:
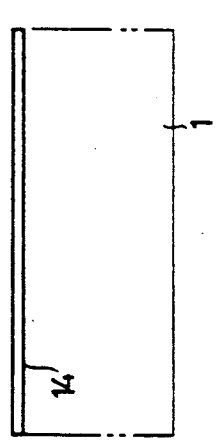

FIG. 7 is a plan view according to an embodiment of the present invention, FIG. 8 is a cross sectional view taken along a line VIII—VIII shown in FIG. 7, and FIG. 9 is a cross sectional view taken along a line VIIII—VIIII shown in FIG. 7.

According to an embodiment of the present invention, adjacent MOS transistors are electrically isolated on both sides of a transfer gate by an LOCOS oxide film 13 as shown in FIG. 7 and at the same time, the bottom surface in a trench capacitor portion and the side wall of a trench between adjacent memory capacitors 33 are electrically isolated by the LOCOS oxide film 13 as shown in FIG. 8. The region in which the LOCOS oxide film 13 is formed on the side wall, corresponds to the surface in which the side wall of an insulating material 4 faces the inside of the trench as shown in FIG. 2.

Figure 1:
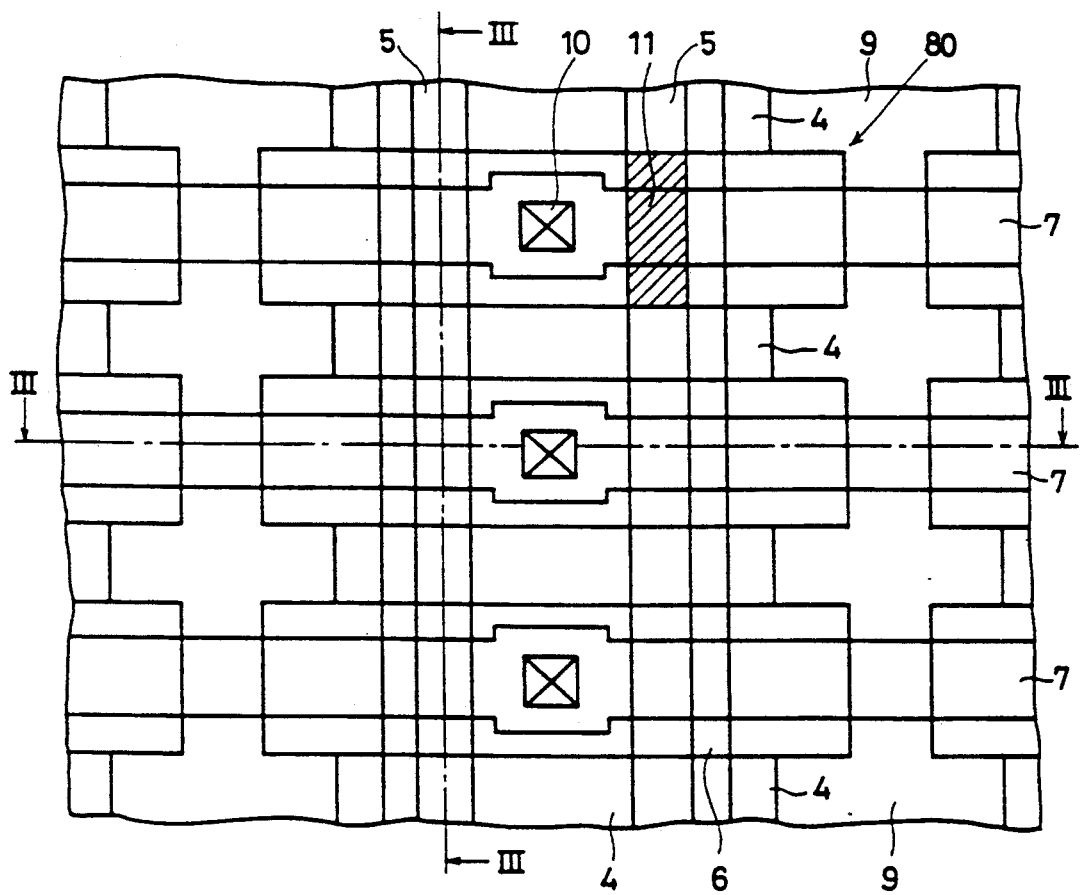
FIG. 1 is a diagram showing a structure of a memory cell portion of a conventional MOS dynamic RAM.
Figure 2:
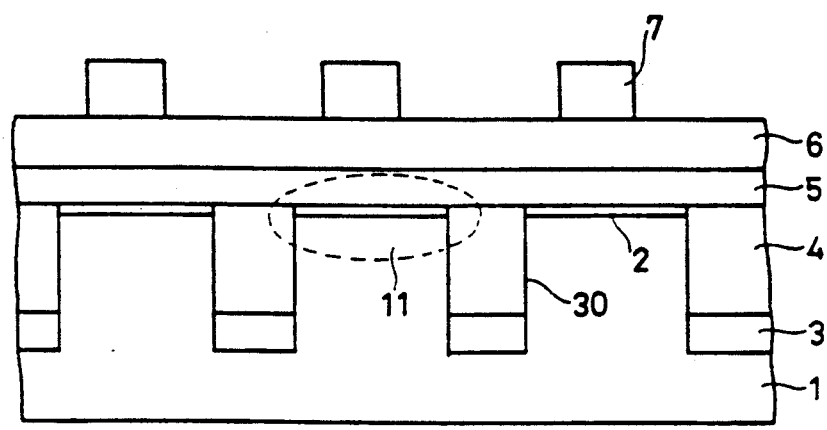
FIG. 2 is a cross sectional view taken along a line II—II shown in FIG. 1.
Figure 3:
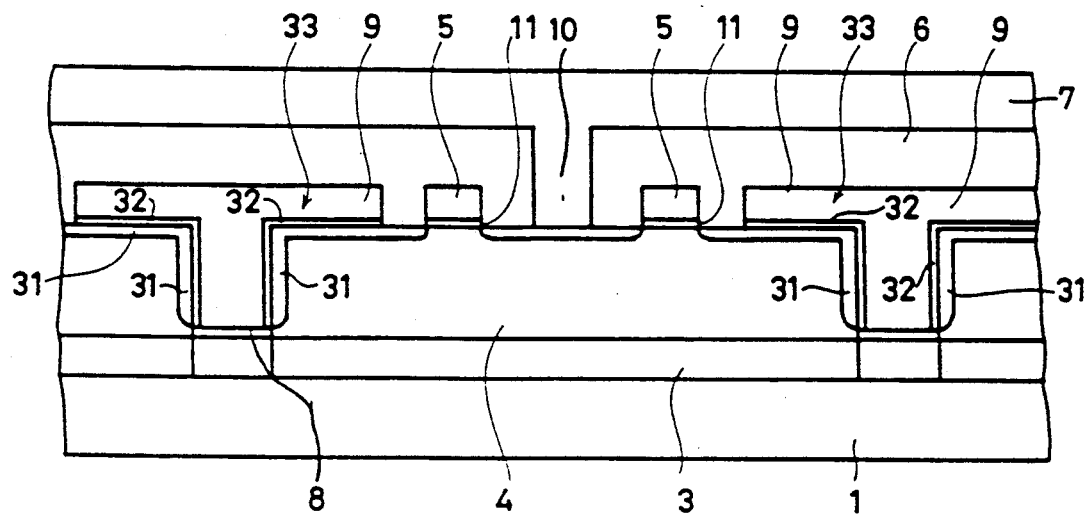
FIG. 3 is a cross sectional view taken along a line III—III shown in FIG. 1.
Figure 4:
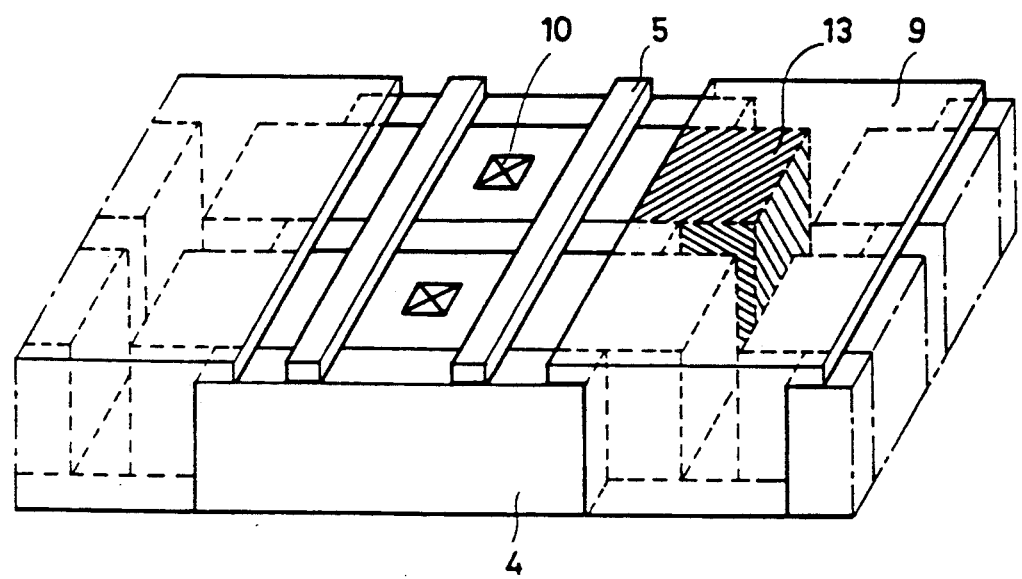
FIG. 4 is a perspective view showing a structure of a cell portion of a dynamic RAM shown in FIG. 1.
Figure 5:
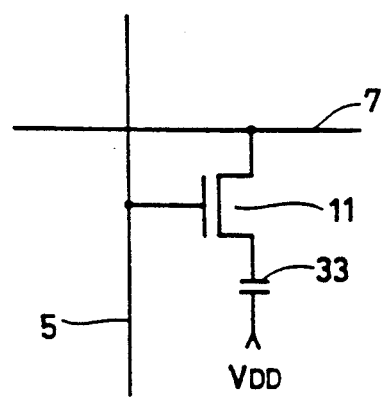
FIG. 5 is an electric circuit diagram of each cell constituting a dynamic RAM.
Figure 6A:
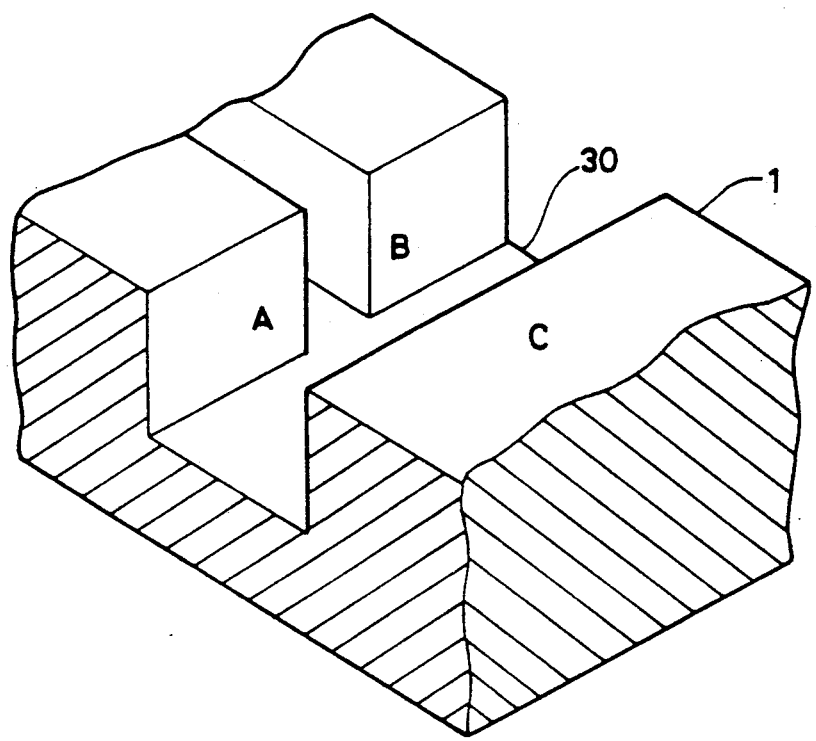
FIGS. 6A and 6B are diagrams for explaining a method for manufacturing a conventional dynamic RAM.
Figure 6B:
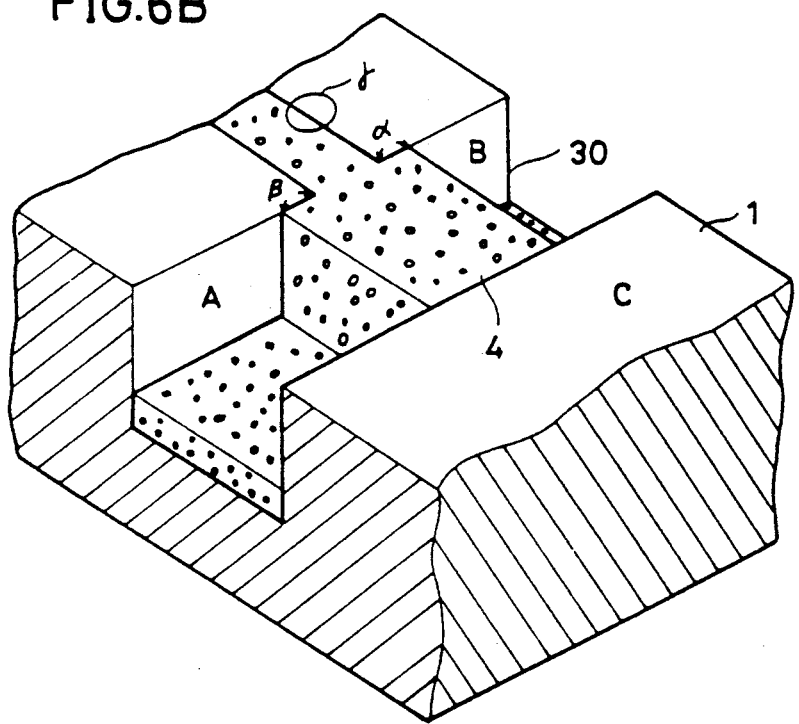

Therefore, only the above described side surface of the portions filled with the insulating material 4 in a conventional example is isolated by an LOCOS oxide film and the others are left without being trenched, so that both sides of a channel 11 of the MOS transistor constituting the transfer gate are isolated by the LOCOS oxide film 13, which is most desirable as a structure of an MOS transistor, as shown in FIG. 2. Therefore, an unusual leakage current generated on both sides of the transfer gate can be reduced to the extent in which there is no problem in practice.

FIGS. 10A to 18A are plan views for explaining a manufacturing method according to an embodiment of the present invention, FIGS. 10B to 18B are cross sectional views taken along a line A—A' shown in FIGS. 10A to 18A, FIGS. 10C to 12C are cross sectional views taken along a line B—B' shown in FIGS. 10A to 12A, FIGS. 13C to 18C are cross sectional views taken along a line C—C' shown in FIGS. 13A to 18A, and FIGS. 13D to 18D are cross sectional views taken along a line B—B' shown in FIGS. 13A to 18A.

Figure 10A:
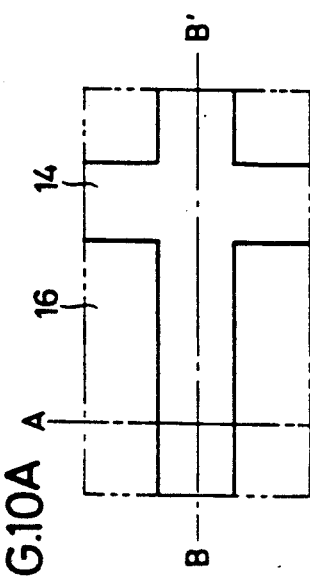

Referring now to FIGS. 10A to 18D, a manufacturing method according to an embodiment of the present invention is described. As shown in FIGS. 10A to 10C, a silicon oxide film 14 is formed with a thickness of less than 100 nm by thermally oxidizing a silicon substrate 1. Thereafter, a silicon nitride film 15 and a silicon oxide film 16 are attached by a CVD process, each having a thickness of less than 500 nm, a pattern is formed by conventional photolithographic means, and the silicon oxide film 16 and the silicon nitride film 15 in an isolation region are removed, which is as shown in FIG. 10A.

Figure 11C:
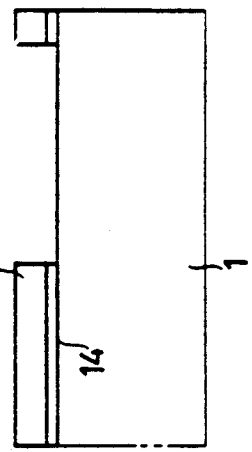
Figure 12C:
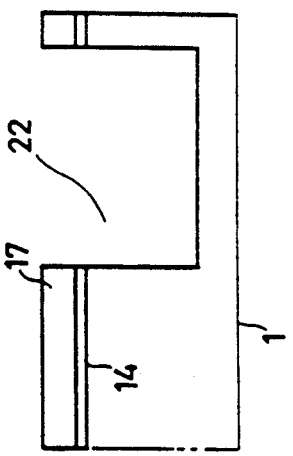
Figure 10B:
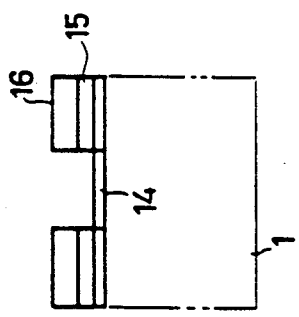
Figure 11B:
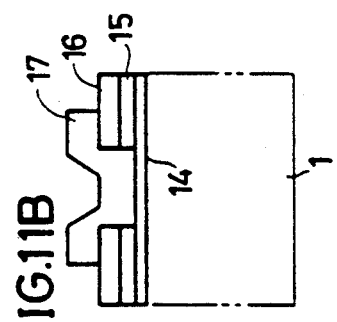
Figure 12B:
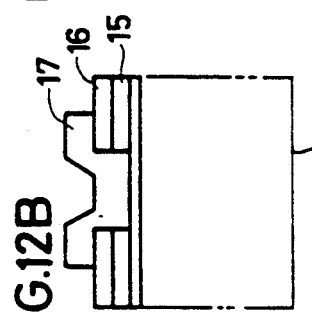
Figure 11A:
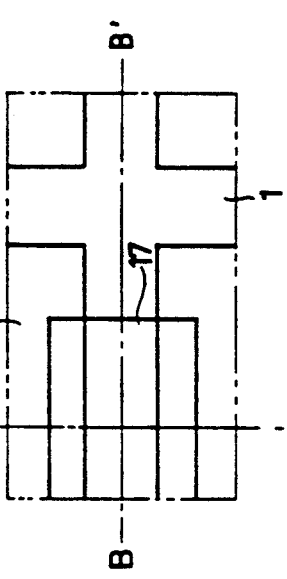
Figure 12A:
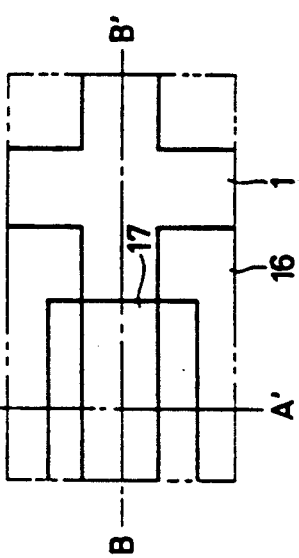
Figure 23A:
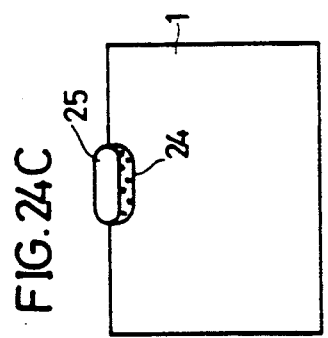
Figure 23B:
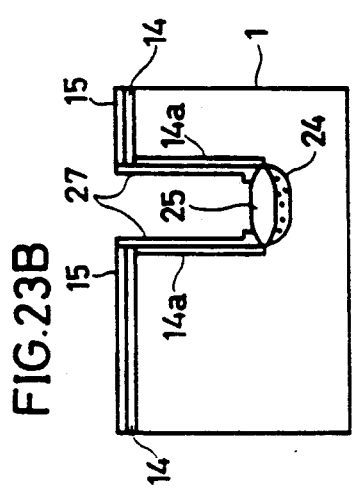
Figure 23C:
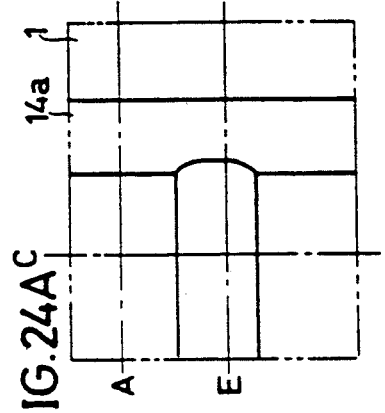
Figure 23D:
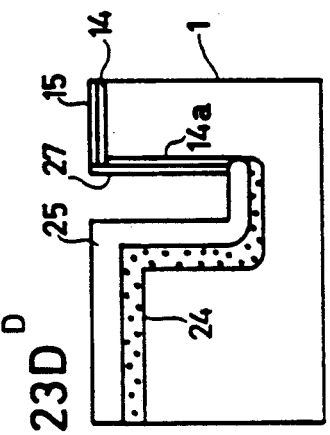
Figure 24A:
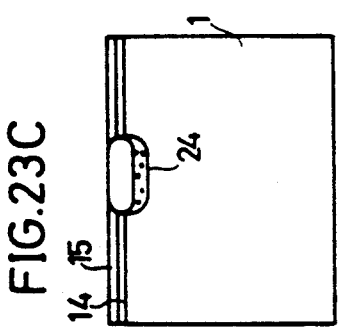
Figure 24B:
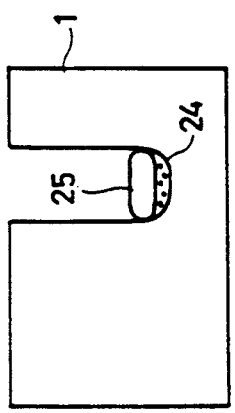
Figure 24C:
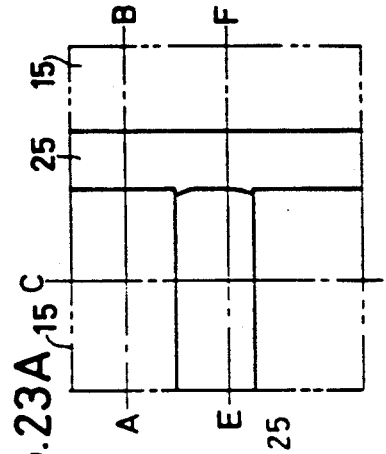
Figure 24D:
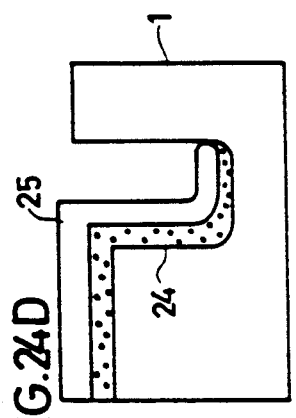

As shown in FIGS. 11A to 11C, a silicon oxide film 17 is formed again by the CVD process and then, a pattern is formed such that the silicon oxide film 17 may be left in such a manner that the region filled with the trench filling insulating material 4 is covered. As shown in FIGS. 12A to 12C, the silicon substrate 1 is etched to a desired depth by anisotropic plasma etching, so that a trench 22 is formed. Then, silicon isotropic etching is applied for a short time, so that a flange portion 23 is formed around the trench structure 22, as shown in FIGS. 13A to 13D. The length of the flange portion 23 can be easily controlled by controlling the time period for isotropic etching.

As shown in FIGS. 14A to 14D, the silicon oxide films 16 and 17 utilized as masks for silicon etching are removed by fluorine etchant. In this step, the LOCOS oxide film 13 is ready to be formed in a planar portion (a portion in which silicon etching is not applied).

However, in this state, the LOCOS oxide film 13 is formed in the entire inside of the trench. To avoid this, a pattern for LOCOS is formed in the trench in a self-aligning manner in the subsequent process. More specifically, as shown in FIGS. 15A to 15D, a silicon oxide film 20 of a thickness of less than 100 nm is formed in a portion in which silicon is exposed, by oxidizing again the whole in the state shown in FIGS. 14A to 14D and then, a silicon nitride film 19 of a thickness of less than 100 nm is attached over the whole by the CVD process. Thereafter, a photoresist 18 is applied with a thickness sufficient to perfectly fill the trench 22.

When the resist 18 is solidified by baking and then anisotropic etching is applied with oxygen plasma, the photoresist 18 is left on the side wall of the trench because the flange portion 23 serves as a masks in the portion in which the flange portion 23 of the silicon nitride film 19 is projected into the upper end of the silicon trench.

As shown in FIGS. 16A to 16D, the silicon nitride film 19 and the silicon oxide film 20 in the portion which is not covered with the photoresist 18 are removed sequentially by isotropic etching for a suitable time period. Thereafter, as shown in FIGS. 17A to 17D, the photoresist 18 is removed and then, the whole is oxidized, so that the LOCOS oxide film 13 is formed in all the required portions including the desired side wall of the trench.

As shown in FIGS. 18A to 18D, when the silicon nitride films 15 and 19 and the underlying silicon oxide film 20 utilized as masks for LOCOS oxidation are removed, the LOCOS isolation oxide film 13 is completely formed in all the desired regions. In the subsequent process, a capacitor electrode 9, the transfer gate and a bit line 7 are formed in a conventional manner.

Although in the above described embodiment, the LOCOS oxide film 13 on the side wall of the trench is perpendicular to the surface of the side wall used as a capacitor, which is illustrated only by way of an embodiment for the purpose of comparison with the conventional example, the surface of the LOCOS oxide film on the side wall of the trench and the surface of the side wall of the capacitor may be arranged in parallel on the identical side surface, in which case the present invention can be applied.

Figure 25:
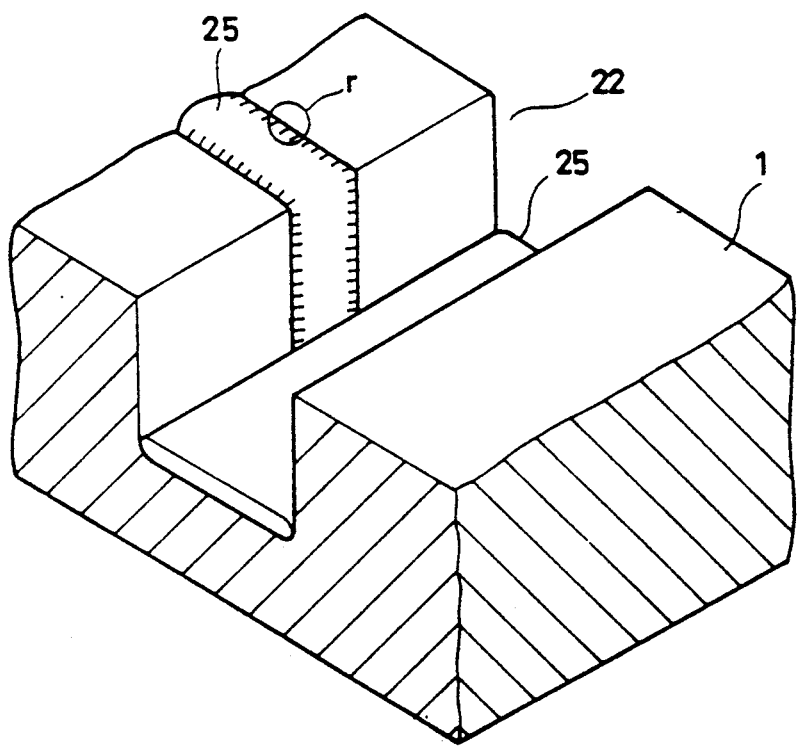
FIG. 25 is a perspective view showing the semiconductor device in a final process step according to another embodiment of the present invention shown in FIGS. 24A to 24D.

FIGS. 19A to 24D are diagrams showing each process step of a method for manufacturing a semiconductor device according to another embodiment of the present invention, FIGS. 19A to 24A are plan views of the semiconductor device, FIGS. 19B to 24B are cross sectional views taken along a line A—B shown in FIGS. 19A to 24A, FIGS. 19C to 24C are cross sectional views taken along a line C—D shown in FIGS. 19A to 24A, and FIGS. 19D to 24D are cross sectional views taken along a line E—F shown in FIGS. 19A to 24A. In addition, FIG. 25 is a perspective view showing the semiconductor device in a final process step according to another embodiment of the present invention shown in FIGS. 24A to 24D.

Referring now to FIGS. 19A to 19D, the silicon oxide film 14 of a thickness of about 100 to 1000Å is formed on the silicon substrate 1 by a thermal oxidation process or the other processes and then, the silicon nitride film 15 of a thickness of 500 to 1500Å and the silicon oxide film 16 of a thickness of 2000 to 3000Å and deposited on the silicon oxide film 14 by the CVD process. In addition, a resist pattern (not shown) is formed on the silicon oxide film 16 by photolithography so that an aperture defining a desired trench region may be defined. Anisotropic plasma etching is applied sequentially to the silicon oxide film 16, the silicon nitride film 15, the silicon oxide film 14 and the silicon substrate 1, so that the trench structure 22 having a desired depth is formed as shown in FIGS. 19B and 19D. At that time, the silicon oxide film 16 acts as an etching mask for trench etching which takes a long time.

Referring now to FIGS. 20A to 20D, the above described resist pattern (not shown) and the silicon oxide film 16 are etched away. Furthermore, the silicon oxide film 14 and a similar silicon oxide film 14a are formed over the entire surface of a cross section of the silicon substrate 1 inside the trench structure 22. In addition, a silicon nitride film 27 of, for example, a thickness of 100Å is deposited over the entire surface of the silicon nitride film 15 and the entire surface of the region inside the trench structure by the CVD process.

Referring now to FIGS. 21A to 21D, resist is applied over the entire surface of the silicon nitride film 27, with a thickness sufficient to fill the trench structure 22, so that the photoresist layer 18 is formed (FIG. 21B). Then, a pattern to define the field isolation region as shown in FIG. 21A is formed by a photolithographic process. In addition, as shown in FIGS. 21A and 21B, a vertical hole 22a is formed which is surrounded with a part of the side surface of the trench structure 22 connected to the field isolation region in the planar portion and a cross section of the photoresist layer 18 and which extends to the bottom surface of the trench structure 22. The hole 22a can be easily formed by anisotropic etching with oxygen plasma, based on a multi-layer resist process described in Sub-Micron Lithography Integrated Technical Data, the fourth paragraph of Chapter V, 1985, pp. 302 in SCIENCE FORUM. After patterning the photoresist layer 18 and forming the hole 22a, freon isotropic plasma etching is performed by the amount corresponding to the thickness of the silicon nitride film 27, so that the silicon nitride film 27 is removed from the filed isolation region in the planar portion and the inside of the hole 22a.

Referring now to FIGS. 22A to 22D, anisotropic plasma etching (Reactive Ion Etching) is performed after removing the photoresist layer 18, so that the silicon nitride film 15 which has been exposed in the field isolation region in the planar portion is removed and the silicon nitride film 27 which has been covered with the resist layer 18 is removed from the entire surface of the silicon substrate 1. However, the silicon nitride film 27 formed on the side surface of the trench structure 22 are left unchanged by anisotropic etching, as shown in FIGS. 22B and 22D. Then, an impurity diffusion layer 24 is formed in the region which is not covered with the silicon nitride film 27 by ion implantation or the like, as shown in FIGS. 22B, 22C and 22D.

Referring now to FIGS. 23A to 23D, the portion in which the silicon nitride film is not formed is selectively oxidized by a conventional LOCOS process, utilizing the silicon nitride film 15 left on the surface of the silicon substrate 1 and the silicon nitride film 27 left on the side surface of the trench structure 22 as oxidization masks, so that an oxide film 25 for field isolation is formed.

Referring now to FIGS. 24A to 24D, the left silicon nitride films 15 and 27 are etched away and the underlying silicon oxide films 14 and 14a are etched away, so that the field oxide film 25 in a desired shape is completely formed on the surface of the silicon substrate 1, and the side surface and the bottom surface of the trench structure 22.

FIG. 25 is a perspective view of the semiconductor device in a final process step shown in FIGS. 24A to 24D. As shown in FIG. 25, according to a manufacturing method of the present invention, the oxide film 25 for field isolation are formed in a self-aligning manner on the respective predetermined regions on the surface of the silicon substrate 1, and the side surface and the bottom surface of the trench structure 22, by the LOCOS process. More specifically, the oxide films for field isolation on the surface and the side surface of the trench are formed in a self-aligning manner so that they may be connected to each other without any offset. Thereafter, no steep step to increase a leak current of a transistor occurs in the region shown by γ in FIG. 25.

Although in the above described embodiment, the silicon nitride film 27 is tightly formed on the silicon nitride film 15 so that the silicon nitride film 15 may be left in the planar portion of the silicon substrate 1, depending on the difference in etching period, a silicon oxide film may be further interposed between the silicon nitride films 15 and 27, in which case selectivity can be utilized depending on the difference in material at the time of anisotropic etching of the silicon nitride film shown in FIGS. 22A to 22D, so that control becomes easy.

Additionally, although in the above described embodiment, the photoresist layer 18 as shown in FIGS. 21A to 21D is used, the layer may be replaced by resin other than resist such as polyimide or inorganic matter such as glass, if it is removed by a multi-layer resist process.

In addition, the other side surface opposed to the field oxide film in the trench structure 22 may be used as the region in which a capacitor or the like is formed.

Figure 26:
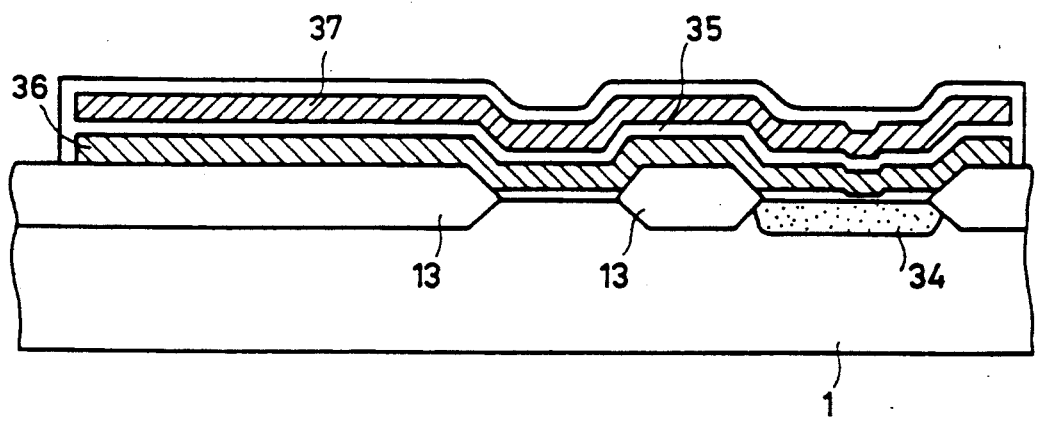
FIG. 26 is a diagram showing a sectional structure of a conventional EEPROM.
Figure 27:
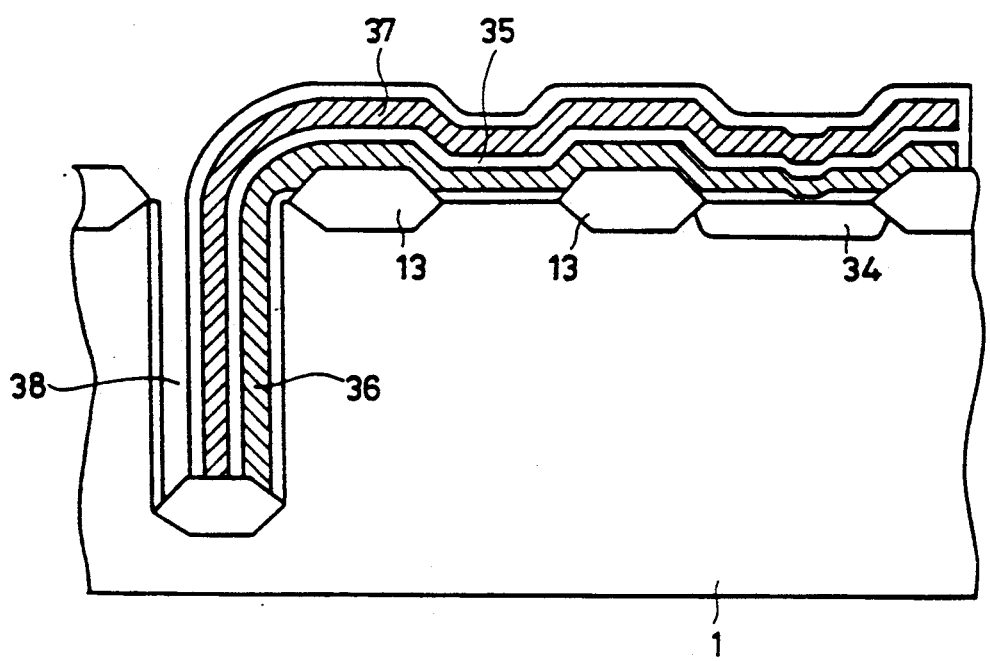
FIG. 27 is a diagram showing a sectional structure of an EEPROM according to the present invention.

FIG. 26 is a diagram showing a sectional structure of a conventional EEPROM, and FIG. 27 is a diagram showing a sectional structure of the EEPROM according to the present invention.

As shown in FIG. 26, the conventional EEPROM is adapted such that an n+ diffusion layer is formed on the silicon substrate 1, a floating gate electrode 36 is formed in an oxide film 35, and a control gate electrode 37 is formed on the oxide film 35. The LOCOS oxide film 13 is formed adjacent to the n+ diffusion layer 34, which defines the width of a transistor. An LOCOS oxide film 13 on the left side in FIG. 16 is disposed for separating adjacent cells. Since the conventional EEPROM forms capacitance in parallel with the silicon substrate 1, it is difficult to obtain large capacitance. However, if a trench 38 is formed in the silicon substrate 1 and the oxide film 35, the floating gate electrode 36 and the control gate electrode 37 are formed in the trench 38, the space required for forming a capacitor can be reduced. In this case, a LOCOS oxide film for isolating adjacent cells is also formed on the bottom portion and the side surface of the trench 38.

Although the present invention has been described and illustrated in detail, it is clearly understood that the same is by way of illustration and example only and is not to be taken by way of limitation, the spirit and scope of the present invention being limited by the terms of the appended claims.

What is claimed is:

1. A method for manufacturing a semiconductor device, comprising:
    a first step for selectively forming an insulating film including a first silicon nitride film on a major surface of a semiconductor substrate,
    a second step for selectively etching said semiconductor substrate utilizing said insulating film as a mask and forming a trench having a wall of a given width and a bottom surface,
    a third step for forming a second silicon nitride film on the entire surface including the major surface of said semiconductor substrate, the wall, and the bottom surface of said trench,
    a fourth step for forming a resist film on the entire surface of said second silicon nitride film, a fifth step for leaving said resist on only a part of the wall of said trench of a width less than said given width and removing the remainder, a sixth step for selectively removing said second silicon nitride film utilizing said resist as a mask, a seventh step for removing said resist, and an eighth step for forming a local field isolation region by a selective oxidation process utilizing said first and second silicon nitride films as left.

2. A method for manufacturing a semiconductor device in accordance with claim 1, wherein said second step comprises a step for performing anisotropic etching of said semiconductor substrate utilizing the insulating film as a mask, and thereafter performing isotropic etching to form said trench and a flange portion which covers a part of the opening forming the trench, and said fifth step comprises a step for performing anisotropic etching of the resist to leave the resist on the part of the wall of the trench only under said flange portion and remove the remainder.

3. A method for manufacturing a semiconductor device in accordance with claim 1, wherein said semiconductor substrate comprises
a memory cell region, and
an isolation region for electrically isolating memory cells formed in said memory cell region, said first step comprises
a step for forming a first silicon nitride film and a first oxide film on the memory cell region in said semiconductor substrate, and
a step for forming a second oxide film in the region in which the trench is not formed, in said isolation region.

4. A method for manufacturing a semiconductor device in accordance with claim 1, wherein said semiconductor substrate comprises
a memory cell region,
a first isolation region disposed in the trench forming region for electrically isolating memory cells formed in said memory cell region, and
a second isolation region orthogonal to said first isolation region, said fifth step comprises a step for removing resist on said second isolation region and on the wall of the trench in the portion in which said second isolation region and said first isolation region intersect, said sixth step comprises a step for removing said second silicon nitride film by isotropic etching, and said eighth step comprises a step for removing said first and second nitride films by etching after the seventh step.

* * * * *